(12) United States Patent  
Kakumu et al.

(10) Patent No.: US 12,369,301 B2  
(45) Date of Patent: Jul. 22, 2025

(54) MEMORY DEVICE WITH SEMICONDUCTOR ELEMENTS

(71) Applicant: Unisantis Electronics Singapore Pte. Ltd., Singapore (SG)

(72) Inventors: Masakazu Kakumu, Tokyo (JP); Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 197 days.

(21) Appl. No.: 18/453,103

(22) Filed: Aug. 21, 2023

(65) Prior Publication Data

US 2024/0074140 A1 Feb. 29, 2024

(30) Foreign Application Priority Data

Aug. 23, 2022 (WO) .................. PCT/JP2022/031700

(51) Int. Cl.
*G11C 11/34* (2006.01)
*G11C 11/404* (2006.01)
(Continued)

(52) U.S. Cl.
CPC ............ *H10B 12/20* (2023.02); *G11C 11/404* (2013.01); *G11C 11/4096* (2013.01)

(58) Field of Classification Search
CPC .... H10B 12/20; G11C 11/404; G11C 11/4096
(Continued)

(56) References Cited

U.S. PATENT DOCUMENTS 11,763,877 B2 * 9/2023 Sakui ................... G11C 7/04  
365/185.29  
11,776,620 B2 * 10/2023 Sakui ................... H10B 12/00  
365/189.011  
(Continued)

FOREIGN PATENT DOCUMENTS

JP    H02188966 A    7/1990  
JP    2003-188279    7/2003  
(Continued)

OTHER PUBLICATIONS

International Search Report and Written Opinion (Japanese and English Translation) in PCT/JP2022/031700, dated Nov. 1, 2022 (15 pages).

(Continued)

*Primary Examiner* — Viet Q Nguyen  
(74) *Attorney, Agent, or Firm* — Crowell & Moring LLP

(57) ABSTRACT

A dynamic flash memory includes a p layer as a semiconductor base material, first and second $n^+$ layers on opposite sides thereof, first and second gate insulating layers in contact with each other and partially covering the p layer, and first and second gate conductor layers electrically isolated from each other and respectively provided on the first and second gate insulating layers. The first and second $n^+$ layers and first and second gate conductor layers are respectively connected to source, bit, word, and plate lines. During writing, 1.0 V, 1.5 V, and 1.2 V are sequentially applied to the bit, plate, and word lines, respectively. During erasing, 2 V is applied to the plate line, and then, a voltage applied to each terminal is always set 0 V or greater (e.g., 0.6 V for the bit line). Further, during reading, voltages are sequentially applied to the bit, plate, and word lines.

13 Claims, 8 Drawing Sheets

(51) Int. Cl.
*G11C 11/4096* (2006.01)
*H10B 12/00* (2023.01)

(58) Field of Classification Search
USPC .......................................................... 365/184
See application file for complete search history.

(56) References Cited

U.S. PATENT DOCUMENTS

| | | | | |
|---|---|---|---|---|
| 11,823,727 | B2* | 11/2023 | Sakui | G11C 16/14 |
| 11,917,807 | B2* | 2/2024 | Sakui | H10D 30/711 |
| 11,990,204 | B2* | 5/2024 | Sakui | G11C 11/404 |
| 11,996,136 | B2* | 5/2024 | Sakui | G11C 16/3418 |
| 12,016,172 | B2* | 6/2024 | Harada | G11C 11/40 |
| 12,096,611 | B2* | 9/2024 | Sakui | G11C 11/4097 |
| 12,100,443 | B2* | 9/2024 | Sakui | G11C 16/24 |
| 12,101,925 | B2* | 9/2024 | Harada | G11C 11/4097 |
| 12,108,589 | B2* | 10/2024 | Sakui | H10B 12/05 |
| 12,131,773 | B2* | 10/2024 | Sakui | G11C 16/10 |
| 12,159,923 | B2* | 12/2024 | Harada | H10D 84/0195 |
| 12,185,522 | B2* | 12/2024 | Sakui | G11C 7/02 |
| 12,277,962 | B2* | 4/2025 | Shirota | H10B 12/20 |
| 2003/0111681 | A1 | 6/2003 | Kawanaka | |
| 2006/0157738 | A1 | 7/2006 | Kawanaka | |
| 2008/0137394 | A1 | 6/2008 | Shimano et al. | |
| 2020/0135863 | A1 | 4/2020 | Han et al. | |
| 2022/0208254 | A1 | 1/2022 | Mu | |
| 2022/0406781 | A1* | 12/2022 | Sakui | G11C 11/406 |
| 2023/0301057 | A1 | 9/2023 | Harada et al. | |

FOREIGN PATENT DOCUMENTS

| | | |
|---|---|---|
| JP | 2008-147514 | 6/2008 |
| JP | 7057032 B1 | 4/2022 |
| WO | WO 2022/137563 A1 | 6/2022 |
| WO | WO 2022/168219 A1 | 8/2022 |

OTHER PUBLICATIONS

Takato, H., et al., "Impact of Surrounding Gate Transistor (SGT) for Ultra-High-Density LSI's", *IEEE Transactions on Electron Devices*, vol. 38, No. 3, Mar. 1991, pp. 573-578 (6 pages).

Chung, H., et al., "Novel $4F^2$ DRAM Cell with Vertical Pillar Transistor(VPT)" *2011 Proceedings of the European Solid-State Device Research Conference* (2011) (4 pages).

Wong, H.S., P., et al., "Phase Change Memory" *Proceedings of the IEEE*, vol. 98, No. 12, Dec. 2010, pp. 2201-2227 (27 pages).

Tsunoda, K., et al., "Low Power and High Speed Switching of Ti-doped NiO ReRAM under the Unipolar Voltage Source of less than 3 V" IEDM (2007) pp. 767-770, (4 pages).

Kang, W., et al., "Reconfigurable Codesign of STT-MRAM Under Process Variations in Deeply Scaled Technology" *IEEE Transactions on Electron Devices*, vol. 62, No. 6, Jun. 2015, pp. 1769-1777 (9 pages).

Ertosun, M. G., et al., "Novel Capacitorless Single-Transistor Charge-Trap DRAM 1T CT DRAM) Utilizing Electrons" *IEEE Electron Device Letters*, vol. 31, No. 5, May 2010, pp. 405-407 (3 pages).

Wan, J., et al., "A Compact Capacitor-Less High-Speed DRAM Using Field Effect-Controlled Charge Regeneration" *IEEE Electron Device Letters*, vol. 33, No. 2, Feb. 2012, pp. 179-181 (3 pages).

Shino, T., et al., "Floating Body RAM Technology and its Scalability to 32nm Node and Beyond", IEEE IEDM (2006) (4 pages).

Song, J., et al., "Design Optimization of Gate-All-Around (GAA) MOSFETs" *IEEE Transactions on Nanotechnology*, vol. 5, No. 3, pp. 186-191, May 2006 (7 pages).

Loubet, N., et al., "Stacked Nanosheet Gate-All-Around Transistor to Enable Scaling Beyond FinFET" *2017 Symposium on VLSI Technology Digest of Technical Pagers*, T230-T231, Jun. 2017 (2 pages).

Jiang, H., et al., "Experimental Investigation of Self-Heating Effect (SHE) in Multiple-Fin SOI FinFETS" *Semicond. Sci. Technol.* 29 (2014) 115021 (9 pages).

Yoshida, E., et al., "A Capacitorless 1T-DRAM Technology Using Gate-Induced Drain-Leakage (GIDL) Current for Low-Power and High-Speed Embedded Memory" *IEEE Transactions on Electron Devices*, vol. 53, No. 4, Apr. 2006 (6 pages).

Morishita, F., et al., "A Capacitorless Twin-Transistor Random Access Memory (TTRAM) on SOI" *IEICE Trans. Electron.*, vol. E90-C, No. 4, Apr. 2007, pp. 765-771 (7 pages).

Ohasawa, T., et al. "Floating Body Cell—A Novel Body Capacitorless DRAM Cell", Pan Stanford Publishing (2011) (140 pages).

Sakui, K., et al., "Dynamic Flash Memory with Dual Gate Surrounding Gate Transistor (SGT) for Computation In Memory" *Proc. IEEE IMW*, pp. 127-128 (2021) (2 pages).

Taur, Y., et al. "Fundamentals of Modern VLSI Devices" (2021) pp. 88-93 (6 pages).

Ohyama, H., et al. "Design, Manufacturing and Reliability Technology of MOS Integrated Circuit" (Japanese and English translation) (2008) (5 pages).

* cited by examiner

MEMORY DEVICE WITH SEMICONDUCTOR ELEMENTS

CROSS REFERENCE TO RELATED APPLICATIONS

This application claims priority to PCT/JP2022/031700, filed Aug. 23, 2022, the entire content of which is incorporated herein by reference.

BACKGROUND OF THE INVENTION

Field of the Invention

The present invention relates to a memory device with semiconductor elements.

Description of the Related Art

In recent years, there has been a demand for a higher degree of integration, higher performance, lower power consumption, and higher functionality of memory devices with semiconductor elements in the technology development of the LSI (Large Scale Integration) technology.

Memory devices with semiconductor elements have been developed with the aim of increasing density and performance. Using SGTs (Surrounding Gate Transistors; see Japanese Patent Laid-Open No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)) as selection transistors can provide, for example, a DRAM (Dynamic Random Access Memory) with a capacitor connected thereto (for example, see H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011)), a PCM (Phase Change Memory) with a variable resistance element connected thereto (for example, see H. S. Philip Wong, S. Raoux, S. Kim, Jiale Liang, J. R. Reifenberg, B. Rajendran, M. Asheghi and K. E. Goodson: "Phase Change Memory," Proceeding of IEEE, Vol. 98, No 12, December, pp. 2201-2227 (2010)), a RRAM (Resistive Random Access Memory; for example, see T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3 V," IEDM (2007)), and a MRAM (Magneto-resistive Random Access Memory) whose resistance is changed by changing the direction of a magnetic spin using a current (for example, see W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015)).

There is also known a capacitorless DRAM memory cell including a single MOS transistor (see M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, Vol. 31, No. 5, pp. 405-407 (2010), J. Wan, L. Rojer, A. Zaslaysky, and S. Critoloveanu: "A Compact Capacitor-Less High-Speed DRAM Using Field Effect-Controlled Charge Regeneration," Electron Device Letters, Vol. 35, No. 2, pp. 179-181 (2012), Takashi Ohasawa and Takeshi Hamamoto, "Floating Body Cell—a Novel Body Capacitorless DRAM Cell", Pan Stanford Publishing (2011), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006), and E. Yoshida: "A Capacitorless 1T-DRAM Technology Using Gate-Induced Drain-Leakage (GIDL) Current for Low-Power and High-Speed Embedded Memory, "IEEE IEDM (2006)), for example. For example, logical memory data "1" is written by retaining in a channel of an N-channel MOS transistor some or all of holes among the holes and electrons generated in the channel through an impact ionization phenomenon based on a source-drain current. Meanwhile, logical memory data "0" is written by removing the holes from the channel. In such a memory cell, it is desired to improve a decrease in the operation margin due to fluctuation of a voltage in the channel with a floating body structure, and also improve degradation of the data retention characteristics resulting from the removal of some of the holes that are the charge carriers stored in the channel.

There is also known a twin-transistor-based MOS transistor memory element obtained by forming a single memory cell in an SOI layer using two MOS transistors (for example, see US2008/0137394 A1, US2003/0111681 A1, and F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI, "IEICE Trans. Electron., Vol. E90-c., No. 4 pp. 765-771 (2007)). For such elements, an $N^+$ layer to serve as the sources or drains, which separates the respective channels with a floating body structure of the two MOS transistors, is formed in contact with an insulating layer provided on the side of a substrate. In such a memory cell also, holes that are charge carriers are stored in the channel of a single MOS transistor. Thus, it is desired to improve a decrease in the operation margin, or improve degradation of the data retention characteristics resulting from the removal of some of the holes that are the charge carriers stored in the channel as with the foregoing memory cell including a single MOS transistor.

There is also known a capacitorless memory including MOS transistors as illustrated in FIGS. 7A to 7D (see U52008/0137394 A1 and K. Sakui, N. Harada, "Dynamic Flash Memory with Dual Gate Surrounding Gate Transistor (SGT), "Proc. IEEE IMW, pp. 72-75 (2021)). As illustrated in FIG. 7A, a semiconductor base material 102 with a floating body structure is provided on a $SiO_2$ layer 101 of a SOI substrate. An $n^+$ layer 103 connecting to a source line SL and an $n^+$ layer 104 connecting to a bit line BL are provided at opposite ends of the semiconductor base material 102 with the floating body structure. In addition, a first gate insulating layer 109a connecting to the $n^+$ layer 103 and covering the semiconductor base material 102 with the floating body structure, and a second gate insulating layer 109b connecting to the $n^+$ layer 104 and covering the semiconductor base material 102 with the floating body structure are provided. Further, a first gate conductor layer 105a covering the first gate insulating layer 109a and connecting to a plate line PL, and a second gate conductor layer 105b covering the second gate insulating layer 109b and connecting to a word line WL are provided. An insulating layer 110 is provided between the first gate conductor layer 105a and the second gate conductor layer 105b. Accordingly, a DFM (Dynamic Flash Memory) memory cell 111 is formed. It should be noted that the source line SL may connect to the n⁺ layer 104, and the bit line BL may connect to the n⁺ layer 103.

As illustrated in FIG. 7A, for example, a voltage of 0 V is applied to the n⁺ layer 103 and a positive voltage is applied to the n⁺ layer 104 so that a first N-channel MOS transistor region, which includes the semiconductor base material 102 with the floating body structure surrounded by the first gate conductor layer 105a, is operated in the saturation region, while a second N-channel MOS transistor region, which includes the semiconductor base material 102 with the floating body structure surrounded by the second gate conductor layer 105b, is operated in the linear region. Consequently, the second N-channel MOS transistor region has no pinch-off point, and an inversion layer 107b is formed on the entire surface in contact with the second gate insulating layer 109b. The inversion layer 107b formed below the second gate conductor layer 105b connecting to the word line WL functions as a substantial drain of the first N-channel MOS transistor region. Consequently, an electric field in the boundary region of the channel region between the first N-channel MOS transistor region and the second N-channel MOS transistor region becomes maximum, and an impact ionization phenomenon occurs in the region. Then, as illustrated in FIG. 7B, a memory write operation is performed by removing electrons, among the electrons and holes generated through the impact ionization phenomenon, from the semiconductor base material 102 with the floating body structure, and retaining some or all of holes 106 in the semiconductor base material 102 with the floating body structure.

Then, as illustrated in FIG. 7C, for example, an erase operation is performed by applying a positive voltage to the plate line PL, a voltage of 0 V to each of the word line WL and the bit line BL, and a negative voltage to the source line SL, thereby removing the holes 106 from the semiconductor base material 102 with the floating body structure. Such a state corresponds to logical memory data "0." Then, in reading data, setting the voltage applied to the first gate conductor layer 105a connecting to the plate line PL to be higher than the threshold voltage corresponding to the logical memory data "1" and lower than the threshold voltage corresponding to the logical memory data "0" can obtain such characteristics that no current flows even when the voltage of the word line WL is set high for reading the logical memory data "0" as illustrated in FIG. 7D. With such characteristics, the operation margin can be significantly increased than that of a capacitorless memory cell including a MOS transistor. In such a memory cell, since the channels of the first N-channel MOS transistor region, which has the first gate conductor layer 105a connecting to the plate line PL as the gate, and the second N-channel MOS transistor region, which has the second gate conductor layer 105b connecting to the word line WL as the gate, are continuous in the semiconductor base material 102 with the floating body structure, it is possible to greatly suppress fluctuation of a voltage in the semiconductor base material 102 with the floating body structure when a selection pulse voltage is applied to the word line WL. This greatly improves the problems of the foregoing memory cells, such as a decrease in the operation margin and degradation of the data retention characteristics resulting from the removal of some of the holes that are the charge carriers stored in the channel. However, such memory elements are desired to have further improved characteristics.

An object of the present invention is to provide a stable method for erasing memory information from a dynamic flash memory that is a memory device.

SUMMARY OF THE INVENTION

An object of the present invention is to provide methods for stably writing, erasing, and reading memory information to/from a dynamic flash memory that is a memory device.

To achieve the foregoing object, a memory device with semiconductor elements according to the present invention . . . .

DETAILED DESCRIPTION OF THE PREFERRED EMBODIMENTS

Hereinafter, the structure of a memory device with semiconductor elements, a driving scheme therefor, and the behavior of carriers stored therein according to an embodiment of the present invention will be described with reference to the drawings.

First Embodiment

The structure and the operation mechanism of a memory cell with semiconductor elements according to a first embodiment of the present invention will be described with reference to FIGS. 1AA to 6B. First, the structure of the memory cell with the semiconductor elements according to the present embodiment will be described with reference to FIGS. 1AA to 1BF. Next, the mechanism of writing data to the memory cell with the semiconductor elements, and the behavior of carriers therein will be described with reference to FIGS. 2A to 2C, operation waveforms during a memory write operation will be described with reference to FIG. 3, the mechanism of a data erase operation will be described with reference to FIGS. 4A and 4B, operation waveforms during a memory erase operation will be described with reference to FIG. 5, and operation waveforms during a memory read operation will be described with reference to FIGS. 6A and 6B.

Figure 1A:
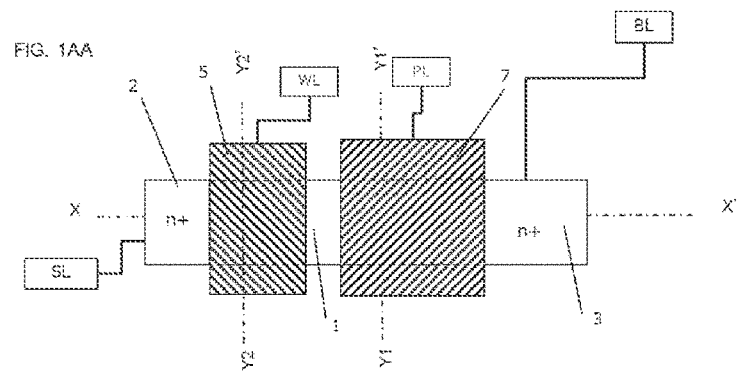
FIGS. 1AA to 1AD are views each illustrating a cross-sectional structure of a memory device with semiconductor elements according to a first embodiment.
Figure 1A:
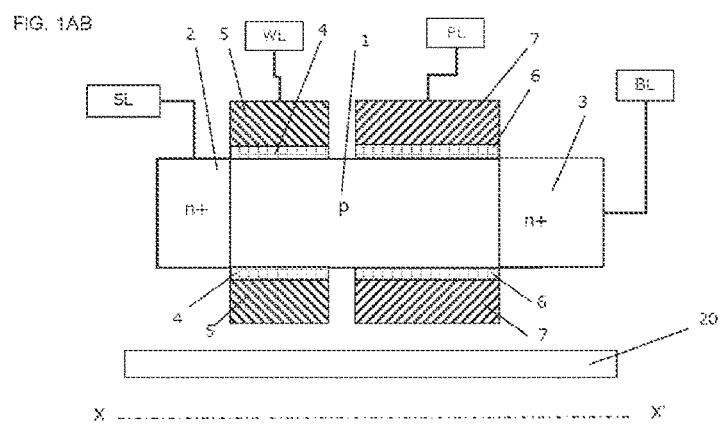
Figure 1A:
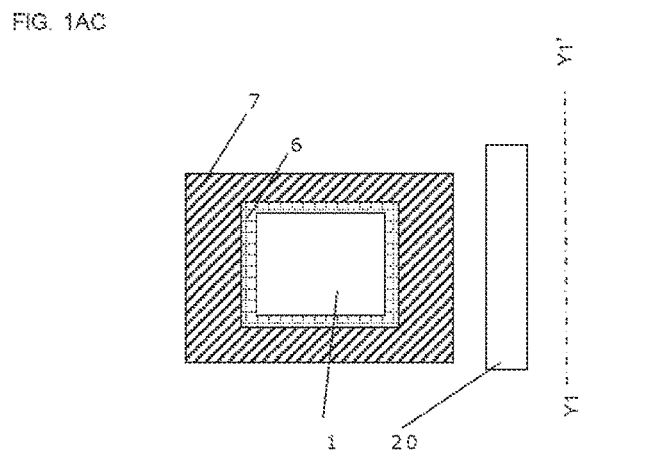
Figure 1A:
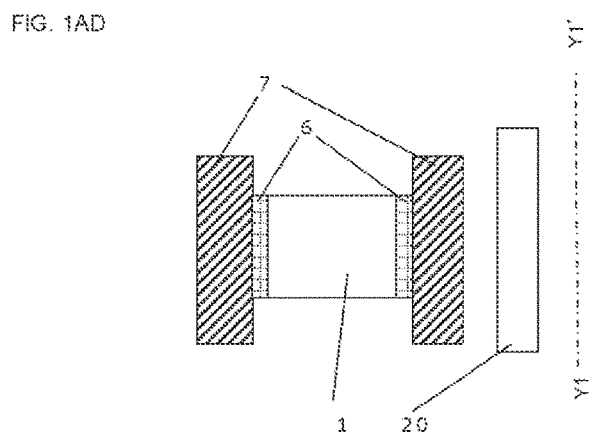
Figure 1B:
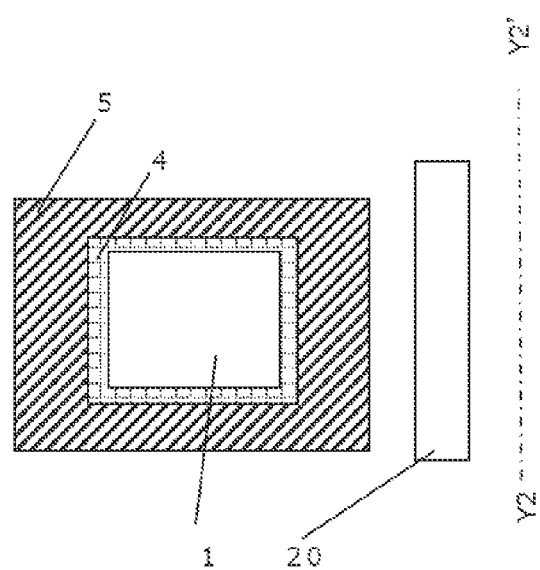
FIGS. 1BE and 1BF are views each illustrating a cross-sectional structure of the memory device with the semiconductor elements according to the first embodiment.
Figure 1B:
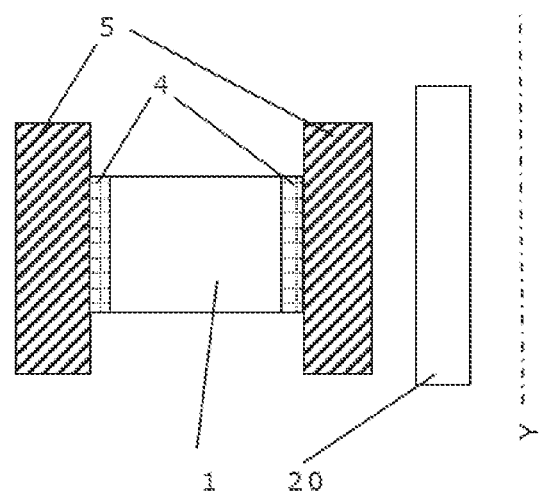

FIGS. 1AA to 1BF illustrate the structure of the memory cell with the semiconductor elements according to the first embodiment of the present invention. FIG. 1AA is a plan view, and FIG. 1AB is a vertical cross-sectional view along line X-X' in FIG. 1AA. FIG. 1AC is a cross-sectional view along line Y1-Y1' in FIG. 1AA, and FIG. 1AD is also a cross-sectional view along line Y1-Y1' in FIG. 1AA as an additional example. FIG. 1BE is a cross-sectional view along line Y2-Y2' in FIG. 1AA, and FIG. 1BF is also a cross-sectional view along line Y2-Y2' in FIG. 1AA as an additional example. That is, the structure in FIG. 1AC may be replaced with the structure in FIG. 1AD, and the structure in FIG. 1BE may be replaced with the structure in FIG. 1BF.

A p layer 1 that is a silicon semiconductor base material with p-type or i-type (intrinsic) conductivity containing acceptor impurities (which is an example of a "semiconductor base material" in the claims) is provided on a substrate 20 (which is an example of a "substrate" in the claims). An n⁺ layer 2 (hereinafter, a semiconductor region containing a high concentration of donor impurities shall be referred to as an "n⁺ layer") (which is an example of a "first impurity layer" in the claims) is provided on one side of the p layer 1 in the horizontal direction. An n⁺ layer 3 (which is an example of a "second impurity layer" in the claims) is provided on the opposite side of the n⁺ layer 2. A gate insulating layer 4 (which is an example of a "first gate insulating layer" in the claims) is provided in contact with or near the n⁺ layer 2 so as to partially cover the surface of the p layer 1. A first gate conductor layer 5 (which is an example of a "first gate conductor layer" in the claims) is provided in proximity to the n⁺ layer 2 so as to partially or entirely surround the gate insulating layer 4. A gate insulating layer 6 (which is an example of a "second gate insulating layer" in the claims) is formed in contact with or near the n⁺ layer 3 so as to partially cover the surface of the p layer 1. A second gate conductor layer 7 (which is an example of a "second gate conductor layer" in the claims) is provided not in contact with the first gate conductor layer 5 but in proximity to the n⁺ layer 3 so as to partially or entirely surround the gate insulating layer 6. Accordingly, the p layer 1, the n⁺ layer 2, the n⁺ layer 3, the gate insulating layer 4, the first gate conductor layer 5, the gate insulating layer 6, and the second gate conductor layer 7 form a single dynamic flash memory cell.

Further, the n⁺ layer 2 is connected to a source line SL (which is an example of a "source line" in the claims) as a wire conductor, the first gate conductor layer 5 is connected to a word line WL (which is an example of a "word line" in the claims) as a wire conductor, and the second gate conductor layer 7 is connected to a plate line PL (which is an example of a "plate line" in the claims) as a wire conductor. The n⁺ layer 3 is connected to a bit line BL (which is an example of a "bit line" in the claims) as a wire conductor. The dynamic flash memory operation is performed by controlling a potential of each of the source line, the bit line, the plate line, and the word line. In the memory device of the present embodiment, the foregoing plurality of dynamic flash memory cells are arranged two-dimensionally or three-dimensionally.

It should be noted that the dynamic flash memory may also be constructed with a structure in which each of the second gate conductor layer 7 and the gate insulating layer 6 is split into two layers on the top and bottom sides of the p layer 1 so as to partially surround the p layer 1 as in FIG. 1AD. In addition, the dynamic flash memory may also be constructed with a structure in which each of the first gate conductor layer 5 and the gate insulating layer 4 is split into two layers on the top and bottom sides of the p layer 1 so as to partially surround the p layer 1 as in FIG. 1BF.

For each of the gate insulating layers 4 and 6, any insulating film used in the common MOS process can be used, such as a $SiO_2$ film, a SiON film, a HfSiON film, or a stacked film of $SiO_2$/SiN, for example.

Although the p layer 1 is a p-type semiconductor in FIGS. 1A and 1B, the concentration of the impurities therein may have a profile. In addition, the concentration of the impurities in each of the n⁺ layer 2 and the n⁺ layer 3 may also have a profile. A LDD (Lightly Doped Drain) may also be provided between the p layer 1 and each of the n⁺ layer 2 and n⁺ layer 3.

When each of the n⁺ layer 2 and the n⁺ layer 3 is formed using a p⁺ layer containing holes as the majority carriers (hereinafter, a semiconductor region containing a high concentration of acceptor impurities shall be referred to as a "p⁺ layer"), forming the p layer 1 using an n-type semiconductor can perform the dynamic flash memory operation by using electrons as the carriers for writing.

Each of the first gate conductor layer 5 and the second gate conductor layer 7 may be formed using metal or metal nitride, such as W, Pd, Ru, Al, TiN, TaN, or WN; an alloy (including silicide) thereof, such as a stacked structure of TiN/W/TaN; or a heavily doped semiconductor as long as the first gate conductor layer 5 can change the potential of part of the memory cell via the gate insulating layer 4 and the second gate conductor layer 7 can change the potential of part of the memory cell via the gate insulating layer 6.

Although FIG. 1A illustrates an example in which the memory cell has a rectangular vertical cross-section as seen in the direction parallel to the sheet surface, the vertical cross-section may be trapezoidal or polygonal, or the memory cell may have a cylindrical shape.

Although FIG. 1AD illustrates an example in which the second gate conductor layer 7 is provided at two portions, that is, on both the top and bottom sides of the p layer 1, the dynamic flash memory operation may also be performed when the second gate conductor layer 7 is provided on one side. This is also true of the first gate conductor layer 5.

Although FIGS. 1A and 1B illustrate the memory cell in which each of the first gate conductor layer 5 and the second gate conductor layer 7 is an integral body, it may be split into two or more layers in the horizontal direction or the vertical direction. In addition, the first gate conductor layer 5 and the second gate conductor layer 7 may be formed using layers of different conductor materials. Further, the gate insulating layer 4 and the gate insulating layer 6 may be formed using layers of different insulating materials.

The behavior of carriers, the storage of the carriers, and a cell current during a write operation for the dynamic flash memory according to the first embodiment of the present invention will be described with reference to FIGS. 2A to 2C. It should be noted that a first MOS transistor region having the first gate conductor layer 5 is indicated as a WL-FET (i.e., a field-effect MOS transistor region connecting to the word line WL), and a second MOS transistor region having the second gate conductor layer 7 is indicated as a PL-FET (i.e., a field-effect MOS transistor region connecting to the plate line PL). In addition, the threshold voltages of the WL-FET and the PL-FET for storing the logical memory data "1" through so-called data writing are respectively expressed as Vth-WL(1) and Vth-PL(1). Further, the threshold voltages of the WL-FET and the PL-FET for storing the logical memory data "0" through data erasing are respectively expressed as Vth-WL(0) and Vth-PL(0).

Figure 2A:
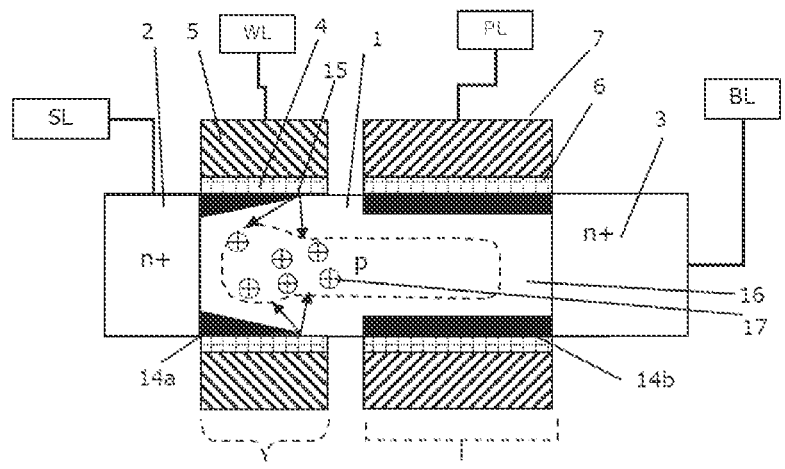
FIGS. 2A to 2C are views for illustrating the storage of hole carriers and a cell current during a write operation for the memory device with the semiconductor elements according to the first embodiment.

As illustrated in FIG. 2A, first, a case will be described where the majority carriers in the n+ layer 2 and the n+ layer 3 are electrons, n+ poly (hereinafter, poly Si containing a high concentration of donor impurities shall be referred to as "n+ poly") is used for the first gate conductor layer 5 connecting to the word line WL and for the second gate conductor layer 7 connecting to the plate line PL, for example, and a p-type semiconductor is used for the p layer 1. To write data to the dynamic flash memory, it is necessary to cause sufficient impact ionization in the portion of the WL-FET or the PL-FET. The conditions of the voltages applied to the bit line BL, the source line SL, the word line WL, and the plate line PL to satisfy such a condition are such that a voltage higher than the Vth-PL(0) is applied to the plate line so that an inversion layer is formed on part of or the entirety of the interface between the second gate insulating layer 6 of the PL-FET and the p layer 1, and the potential of the bit line is transmitted to the entire channel of the PL-FET, and also, a voltage higher than the WL-Vth(0) is applied to the word line to allow a current to flow from the bit line to the source line. In addition, as the voltage applied to the bit line, it is necessary to apply a voltage that allows a maximum electric field for generating impact ionization to be greater than or equal to $10^5$ V/cm. (for example, see Yuan Taur and Tak. H. Ning, "Fundamentals of Modern VLSI Devices" (2021), and Oyama, Nakabayashi, Hayama, Eguchi, "Design/Manufacture and Reliability Technique of MOS Integrated Circuit" (2008)).

Examples of the voltages applied to write data to the memory will be described below based on the foregoing description. Herein, when Vth-WL (0)=Vth-PL (0)=1.0 V is input to the source line SL connected to the n+ layer 2, for example, 1.0 V is input to the bit line BL connected to the n+ layer 3, for example, 1.5 V is input to the plate line PL connected to the second gate conductor layer 7, for example, and 1.2 V is input to the first gate conductor layer 5 connected to the word line WL, for example.

In such a voltage applied state, an inversion layer 14b is formed on the entire surface on the inner side of the gate insulating layer 6. In addition, an inversion layer 14a is formed in part of a region on the inner side of the gate insulating layer 4. A pinch-off point 15 at which the inversion layer 14a disappears is present on the inner side of the gate insulating layer 4, and an electric field becomes maximum at the pinch-off point 15. In this example, the maximum electric field is about $4 \times 10^5$ V/cm. Then, electrons flow in the direction from the n+ layer 2 to the n+ layer 3. Consequently, an impact ionization phenomenon occurs in a region around the pinch-off point 15. Due to the impact ionization phenomenon, electrons accelerated toward the n+ layer 3 connected to the bit line BL from the n+ layer 2 connected to the source line SL collide with Si lattices, and electron-hole pairs are generated due to the kinetic energy. Some of the generated electrons flow into the first gate conductor layer 5, but most of them flow into the n+ layer 3 connected to the bit line BL.

Figure 2B:
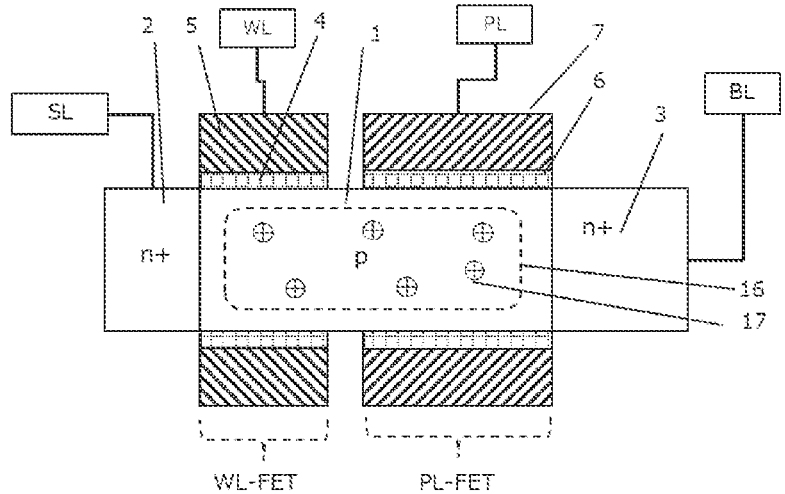
Figure 2C:
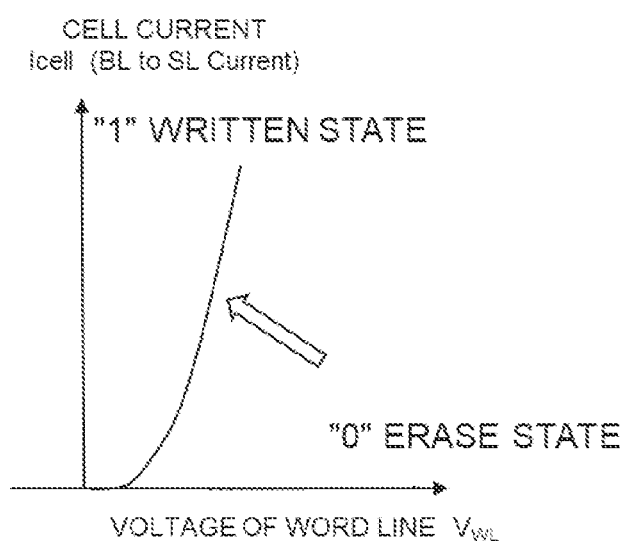

FIG. 2B illustrates holes 17 in the p layer 1 when all biases have become 0 V immediately after the writing. The generated holes 17 are the majority carriers in the p layer 1, and are temporarily stored in the p layer 1 surrounded by a depletion layer 16, and thus charge the p layer 1, which is substantially a substrate of the WL-FET and the PL-FET, in a positively biased manner in the non-equilibrium state. Consequently, each of the threshold voltage of the WL-FET including the first gate conductor layer 5 and the threshold voltage of the PL-FET including the second gate conductor layer 7 becomes lower than that in the initial state due to the positive substrate bias effect because of the holes temporarily stored in the p layer 1. For example, under the foregoing voltage application conditions, Vth-WL(1)=Vth-PL(1)=0.5 V. When a voltage higher than such a lowered threshold voltage is applied to the plate line PL, the PL-FET is turned on, and the WL-FET operates as a MOS transistor. Accordingly, as illustrated in FIG. 2C, in the WL-FET having the first gate conductor layer 5 connected to the word line WL, a current having dependence on the voltage of the word line WL flows from the n+ layer 3 to the n+ layer 2. Such a written state is allocated as logical memory data "1."

Figure 3:
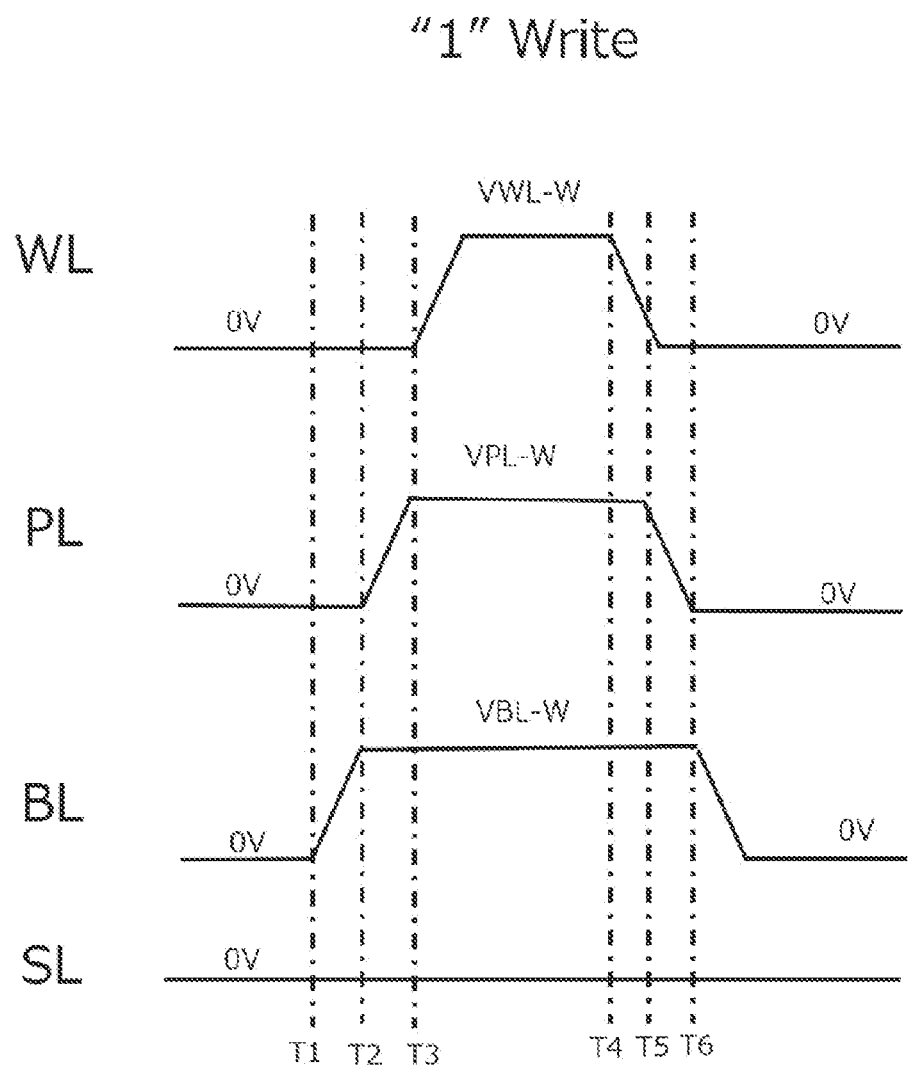
FIG. 3 is a chart for illustrating operation waveforms during a write operation for the memory device with the semiconductor elements according to the first embodiment.
Figure 4A:
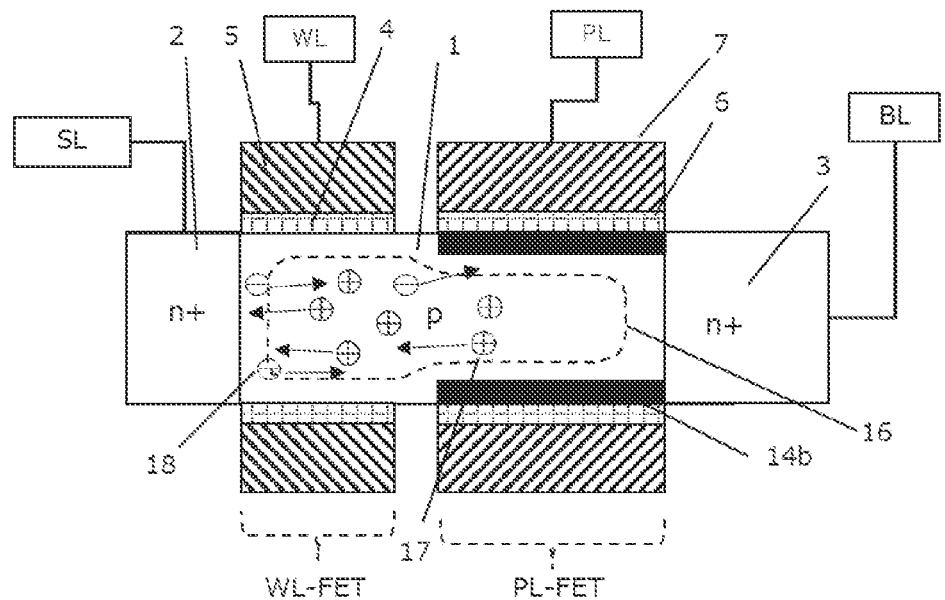
FIGS. 4A and 4B are views for illustrating an erase operation for the memory device with the semiconductor elements according to the first embodiment.

FIG. 3 is a chart illustrating the operating waveforms of voltages applied to the bit line BL, the source line SL, the word line WL, and the plate line PL during the memory write operation. At a first time T1, the voltage of the bit line BL rises from the ground voltage Vss to VBL-W. The ground voltage Vss herein is 0 V, for example. In addition, the VBL-W is 1.0 V, for example. Next, at a second time T2, the voltage of the plate line PL rises from the ground voltage Vss to VPL-W. The voltage herein is 1.5 V, for example, that is high enough for the inversion layer 14b to be formed on the inner side of the gate insulating layer 6 on the inner side of the second gate conductor layer 7 connected to the plate line PL. Next, at a third time T3, the voltage of the word line is increased from the ground voltage Vss to a third voltage VWL-W. The voltage herein is 1.2 V, for example, that is high enough to turn on the WL-FET. Accordingly, the WL-FET having the first gate conductor layer 5 connected to the word line WL operates in the saturation region, and a current flows therethrough, and also, a high electric field state can be formed in the WL-FET during the voltage rise of the word line WL. This increases the impact ionization rate, and can provide voltage application conditions that can generate a maximum substrate current (for example, see Yuan Taur and Tak. H. Ning, "Fundamentals of Modern VLSI Devices" (2021)). Thus, the memory write operation can be executed efficiently. When the order in which the voltages are increased is reversed, for example, when the voltage of the bit line BL is increased after the voltage of the word line WL and the voltage of the plate line PL are increased, a current flows, but it is more difficult to create a high electric field state in comparison with the present invention illustrated in FIG. 3. This results in a lower impact ionization rate, and thus, the write operation cannot be performed sufficiently. For this reason, the order in which the signals rise and fall is important.

Further, when the timings of lowering the voltages of the word line WL, the plate line PL, and the bit line BL from the VWL-W, the VPL-W, and the VBL-W, respectively, are set to an order: T4→T5→T6 in FIG. 3, it is also possible to form a high electric field state in the transistor during the voltage drop of the word line WL as in the voltage rise time. This increases the impact ionization rate, and thus allows a write operation to be performed even during the voltage drop, so that the write operation can be executed reliably.

In addition to the foregoing example, the conditions of the voltages applied to the bit line BL, the source line SL, the word line WL, and the plate line PL may be other combinations, such as 0 V (VSL-W)/1.0 V (VBL-W)/2.0 V (VPL-W)/2.0 V (VWL-W), 0 V (VSL-W)/1.5 V (VBL-W)/3.0 V (VPL-W)/1.0 V (VWL-W), and 0 V (VSL-W)/1.0 V (VBL-W)/1.2 V (VPL-W)/2.0 V (VWL-W), as long as the order in which the voltages are applied is not changed. The voltage relationship between the bit line BL and the source line SL may be reversed. However, when 1.0 V is applied to the bit line BL, 0 V is applied to the source line SL, 2.0 V is applied to the word line WL, and 1.2 V is applied to the plate line PL, the position of the pinch-off point 15 is shifted toward the gate conductor layer 7, but a similar phenomenon may be caused to occur.

Next, the mechanism of an erase operation for the dynamic flash memory of the first embodiment will be described with reference to FIGS. 3A and 3B. To erase information from the dynamic flash memory, it is necessary that the stored holes recombine with electrons in a short time, and the electrons to recombine with the holes be supplemented from an electrode connecting to the memory. The conditions of the voltages applied to the bit line BL, the source line SL, the word line WL, and the plate line PL to satisfy such a condition are such that a voltage higher than the voltage of the Vth-PL(0) is applied to the plate line to form an inversion layer on the entire surface on the inner side of the gate insulating layer 6, thereby forming the inversion layer 14b at the interface between the gate insulating layer 6 of the PL-FET and the p layer 1, and thus increasing the area in which the holes stored in the p layer 1 can recombine with electrons, and a voltage lower than the WL-Vth (0) or 0 V is applied to the word line to form a depletion layer in the p layer 1 on the inner side of WL-FET. As the voltage applied to the bit line, it is possible to apply a voltage that allows electrons injected from the source line to move to the bit line by drifting, for example, a voltage that allows a maximum electric field of greater than or equal to $10^4$ V/cm to be applied.

Figure 4B:
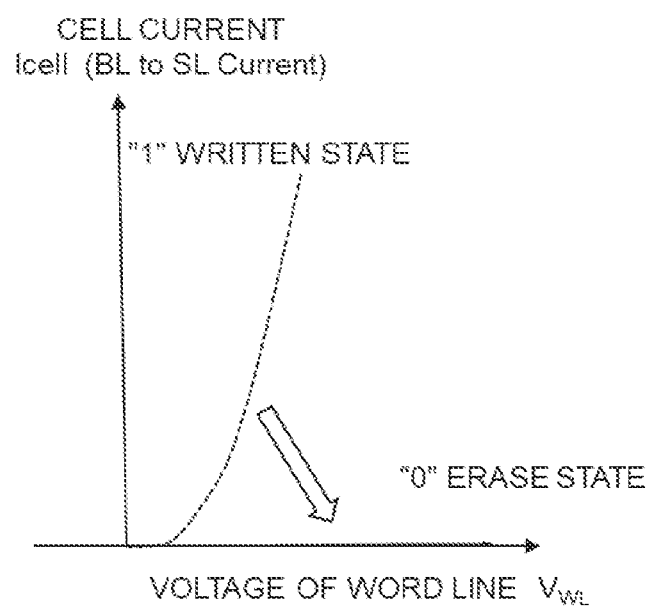

An example of the erase operation for the dynamic flash memory of the first embodiment illustrated in FIG. 1 will be described with reference to FIG. 4. In the state illustrated in FIG. 2B, a voltage of 0.6 V is applied to the bit line BL, a voltage of 0 V is applied to the source line SL, a voltage of 2 V is applied to the plate line PL, and a voltage of 0 V is applied to the word line WL. Consequently, as the concentration of the holes 17 stored in the p layer 1 is sufficiently higher than the concentration of holes in the $n^+$ layer 2, the holes flow into the $n^+$ layer 2 due to diffusion because of the concentration gradient. Conversely, as the concentration of electrons in the $n^+$ layer 2 is higher than the concentration of electrons in the p layer 1, electrons 18 flow into the p layer 1 due to diffusion because of the concentration gradient. The electrons that have flowed into the p layer 1 recombine with the holes in the p layer 1, and thus disappear. However, not all of the injected electrons 18 disappear, and the electrons 18 that have not disappeared pass through the depletion layer 16 by drifting due to the potential gradient between the bit line BL and the source line SL, and then flow into the $n^+$ layer 3. Since the electrons are supplied from the source line SL one after another, the excess holes recombine with the electrons in quite a short time, and thus return to the initial state. The power consumed at this time is attributable to the electrons flowing from the source line SL, and thus is far lower than the power consumed during writing. Accordingly, as illustrated in FIG. 4B, each of the threshold voltage of the WL-FET including the first gate conductor layer 5 connected to the word line WL and the threshold voltage of the PL-FET including the second gate conductor layer 7 connected to the plate line PL returns to the original level. As illustrated in FIG. 4B, even when the voltage of the word line WL is set high, no current flows through the WL-FET including the first gate conductor layer 5 connected to the word line WL. Such an erase state of the memory element corresponds to logical memory data "0."

Figure 5:
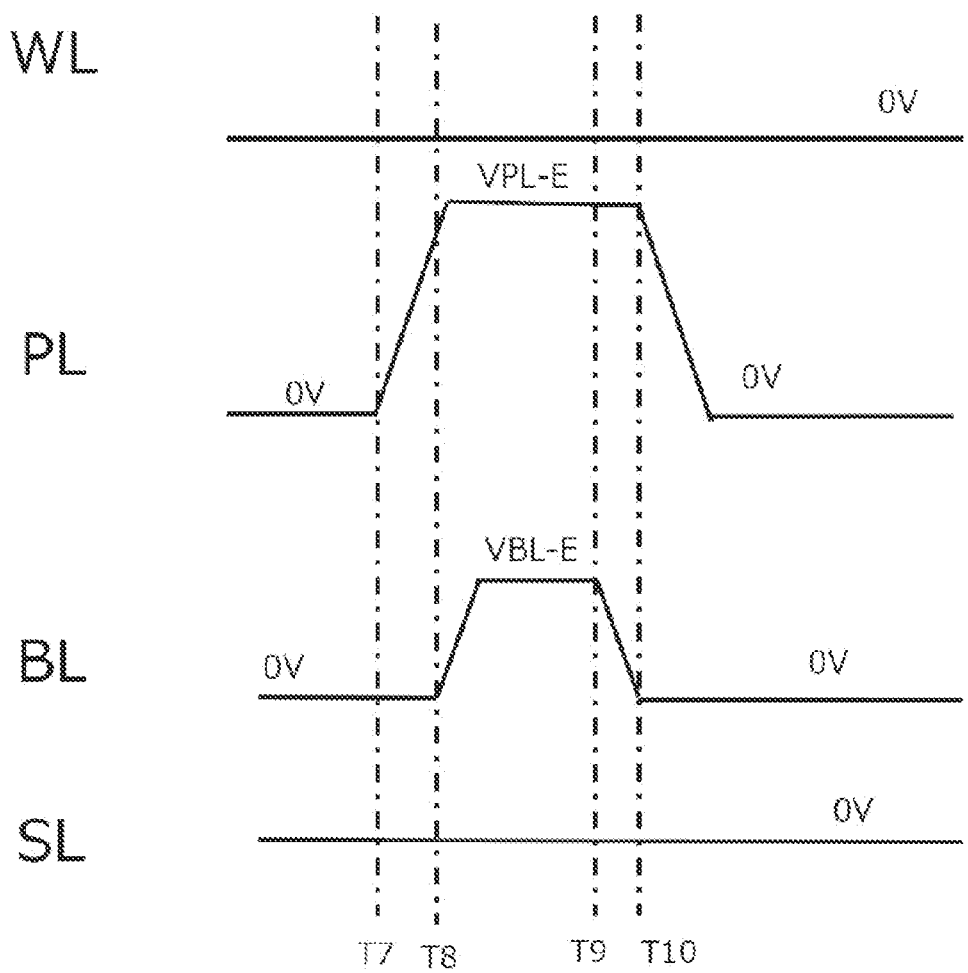
FIG. 5 is a chart for illustrating operation waveforms during an erase operation for the memory device with the semiconductor elements according to the first embodiment.

FIG. 5 is a chart illustrating the operation waveforms of voltages applied to the bit line BL, the source line SL, the word line WL, and the plate line PL during the memory erase operation. At a seventh time T7, the voltage of the plate line PL rises from the ground voltage Vss to a voltage VPL-E. The ground voltage Vss herein is 0 V, for example. The VPL-E is 2.0 V, for example, that is high enough for the inversion layer 14b to be formed immediately below the gate insulating film 6 on the inner side of the second the gate conductor layer 7 connected to the plate line PL. Next, at an eighth time T8, the voltage of the bit line BL rises from the ground voltage Vss to a voltage VBL-E. The voltage VBL-E is 0.6 V, for example. Accordingly, the inversion layer 14b is formed on the inner side of the gate insulating layer 6 of the PL-FET having the second the gate conductor layer 7 connected to the plate line PL so that the area in which holes and electrons recombine is increased, and also, potentials are provided to the bit line BL and the source line SL. Then, an electric field is formed between the first impurity layer and the second impurity layer, and the electrons to recombine with the holes can be supplemented. Thus, the erase operation can be performed efficiently.

When the order of increasing the voltages is reversed such that the voltage of the bit line BL is increased first, an inversion layer is not formed on the inner side of the gate insulating layer 6 of the PL-FET, and thus, the area in which holes and electrons recombine does not increase, which thus hardly contributes to an erase operation. When the voltage of the plate line PL is increased thereafter, no current flows, but the voltage temporarily becomes a level that causes the electric field in the memory to have a maximum value, resulting in a high impact ionization rate. Thus, such a phenomenon is similar to a kind of write operation, and thus is not preferable for the erase operation.

In the foregoing, the power consumption during erasing is far lower than the power consumption during writing. This is because the value of a current flowing between the bit line BL and the source line SL during erasing is lower than that during writing, and also because the voltage applied to the bit line BL during erasing is lower than that during writing.

Note that the maximum electric field between the bit line and the source line that is greater than or equal to $10^4$ V/cm would be sufficient for carriers to move by drifting. Therefore, even when the voltage applied to the bit line is higher or lower than 0.6 V indicated above, it is acceptable as long as a voltage that is sufficient to allow a drift of electrons to occur in the depletion layer 16 is applied to the bit line.

An erase operation may be similarly performed by applying a voltage higher than the Vth-WL(0) to the word line to form an inversion layer, and applying 0 V or a voltage lower than the Vth-PL(1) to the plate line so as not to form an inversion layer.

In the description of the present embodiment, the first gate conductor layer 5 that is adjacent to the $n^+$ layer 2 is connected to the word line WL, and the second gate conductor layer 7 that is adjacent to the $n^+$ layer 3 is connected to the plate line PL. In contrast, a memory erase operation of the present invention may also be performed by providing the second gate conductor layer 7 connected to the plate line PL at a position adjacent to the $n^+$ layer 2 and providing the first gate conductor layer 5 connected to the word line WL at a position adjacent to the $n^+$ layer 3.

As a method of erasing data other than that exemplarily described above, the conditions of the voltages applied to the bit line BL, the source line SL, the word line WL, and the plate line PL may be other combinations, such as 0 V (VSL-E)/0.6 V (VBL-E)/2.0 V (WPL-E)/0 V (VWL-E), 0 V (VSL-E)/0.6 V (VBL-E)/2.0 V (VPL-E)/0.2 V (VWL-E), and 0 V (VSL-E)/1.5 V (VBL-E)/2.0 V (VPL-E)/0 V (VWL- E). The foregoing conditions of the voltages applied to the bit line BL, the source line SL, the word line WL, and the plate line PL are only examples for performing a memory erase operation. Thus, any other operating voltage conditions that allow for a memory erase operation may be used.

Figure 6A:
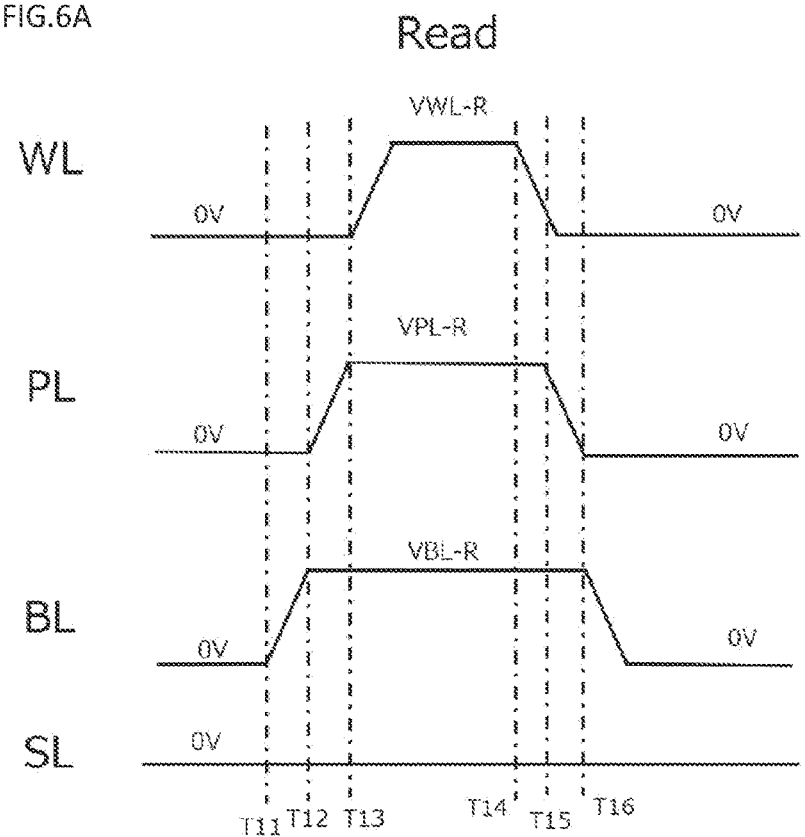
FIGS. 6A and 6B are charts for illustrating operation waveforms during a read operation for the memory device with the semiconductor elements according to the first embodiment.

Next, a read operation for the dynamic flash memory illustrated in FIG. 1 will be described with reference to an operation waveform chart in FIG. 6A. At an eleventh time T11, the voltage of the bit line BL rises from the ground voltage Vss to a voltage VBL-R. The ground voltage Vss herein is 0 V, for example. Next, at a twelfth time T12, the voltage of the plate line PL rises from the ground voltage Vss to a voltage VPL-R. Finally, at a time T13, the voltage of the word line WL is increased from the ground voltage Vss to a voltage VWL-R. Then, it is possible to determine whether the stored memory information is "1" or "0" based on whether a given value or more of a current flows through the bit line BL. After the information is read, at a fourteenth time T14, the voltage of the word line WL is lowered from the voltage VWL-R to the ground voltage Vss, and at the following fifteenth time T15, the voltage of the plate line PL is lowered from the voltage VPL-R to the ground voltage Vss, and finally, at a sixteenth time T16, the voltage of the bit line BL is lowered from the voltage VBL-R to the ground voltage Vss.

It should be noted that the read operation should be performed under the conditions that the VWL-R is a voltage higher than the Vth-WL(1), and the VPL-R is a voltage higher than the Vth-PL(1) and lower than the Vth-PL(0) for erasing data. Besides, the VBL-R should be a voltage higher than the voltage that allows a maximum electric field for generating impact ionization in the WL-FET or the PL-FET for storing data "1" to be greater than or equal to $10^3$ V/cm.

According to such a waveform chart, when data is read from a memory cell with the logical memory data "0," the PL-FET is not turned on since the VPL-R is lower than the Vth-PL(0). Thus, even when a pulse of the VWL-R is applied, the PL-FET of the dynamic flash memory is not turned on, and no cell current flows therethrough, and thus, the logical memory data "0" results. Meanwhile, when data is read from a memory cell with the logical memory data "1," the PL-FET is turned on since the VPL-R is higher than the Vth-PL(1). Further, since a voltage higher than the Vth-WL(1) is applied as the VWL-R, both the FETs are turned on. Thus, the dynamic flash memory becomes an on-state, and a cell current flows therethrough, so that the logical memory data "1" results. The conditions of the voltages applied during the read operation for the memory cell with the stored information data "1" are different from those applied during the write operation, but the order in which the voltages are increased and lowered in the read operation is the same as that in the write operation, and a cell current flows through the memory cell as in the write operation. Further, when the voltage of the word line rises at T13, or when the voltage of the word line drops at or after T14, a high electric field state can be created in the memory. Thus, excess holes are generated through impact ionization, and the information "1" can be written in an overlapped manner. When the stored information data is "0," such a phenomenon does not occur because no current flows through the memory cell.

When a memory cell with the logical memory data "0" is not a read target, there is a possibility that each of the word line WL and the plate line PL may be at 0 V, and a pulse of the VBL-R may be applied to the bit line BL. According to the foregoing voltage setting, the PL-FET is not turned on. Thus, the logical memory data "0" is not destroyed. There is also a possibility that the VBL-R may be 0 V, a pulse of the VWL-R may be applied to the word line WL, and a pulse of the VPL-R may be applied to the plate line PL. In such a case, an inversion layer is formed on the inner side of the gate insulating layer 4 of the WL-FET, but since the voltages of the bit line BL and the source line SL are fixed at 0 V, there is no possibility that the stored memory information "0" will change. Thus, data in the memory cell with the logical memory data "0" is not influenced by read operations for other memory cells.

Meanwhile, when a memory cell with the logical memory data "1" is not a read target, there is a possibility that each of the word line WL and the plate line PL may be at 0 V, and a pulse of the VBL-R may be applied to the bit line BL. According to the foregoing voltage setting, neither the WL-MOSFET nor the PL-FET is turned on. Thus, the stored logical memory data "1" is not destroyed.

There is also a possibility that the VBL-R may be 0 V, a pulse of the VWL-R may be applied to the word line WL, and a pulse of the VPL-R may be applied to the plate line PL. In such a case, an inversion layer is formed on the inner side of the gate insulating layer 4 of the WL-FET, and thus, some holes and electrons recombine therein. However, when the recombination has progressed to a certain degree, the PL-FET is turned off at a time point when the threshold voltage of the PL-FET has become higher than the VPL-R. Thus, even if the operation is further continued, there is no possibility that the stored information data "1" will change. Further, when "1" is read, "1" is automatically re-written. Thus, the stored information data "1" will not degrade. Thus, data in the memory cell with the logical memory data "1" is not influenced by read operations for other memory cells.

Described heretofore is a case where the $n^+$ layers 2 and 3 are provided and the majority carriers for writing are holes. In contrast, when $p^+$ layers are provided instead of the $n^+$ layers and the majority carriers for writing are electrons, it follows that the PL-FET and the WL-FET are P-channel FETs, the p layer 1 is an n-type semiconductor, and the majority carriers are electrons, and also, the polarity of each of the potentials provided to the bit line, the word line, and the plate line, which is positive in the foregoing examples, is negative. Thus, it would be appropriate to say that "0 V or a voltage lower than the Vth-PL(0) is applied to the plate line" when erasing is performed, for example. As described above, the expression of a threshold voltage that is "high" or "low" may be inappropriate depending on the type of the MOS transistor. Thus, it would be more appropriate to express a threshold voltage using "the absolute value of the threshold voltage and the polarity of the threshold voltage (i.e., positive or negative)." For example, using such an expression, it is possible to say that "a voltage that has an absolute value greater than or equal to the absolute value of the threshold voltage of the MOS transistor region and has the same polarity as the polarity of the threshold voltage is applied."

Figure 6B:
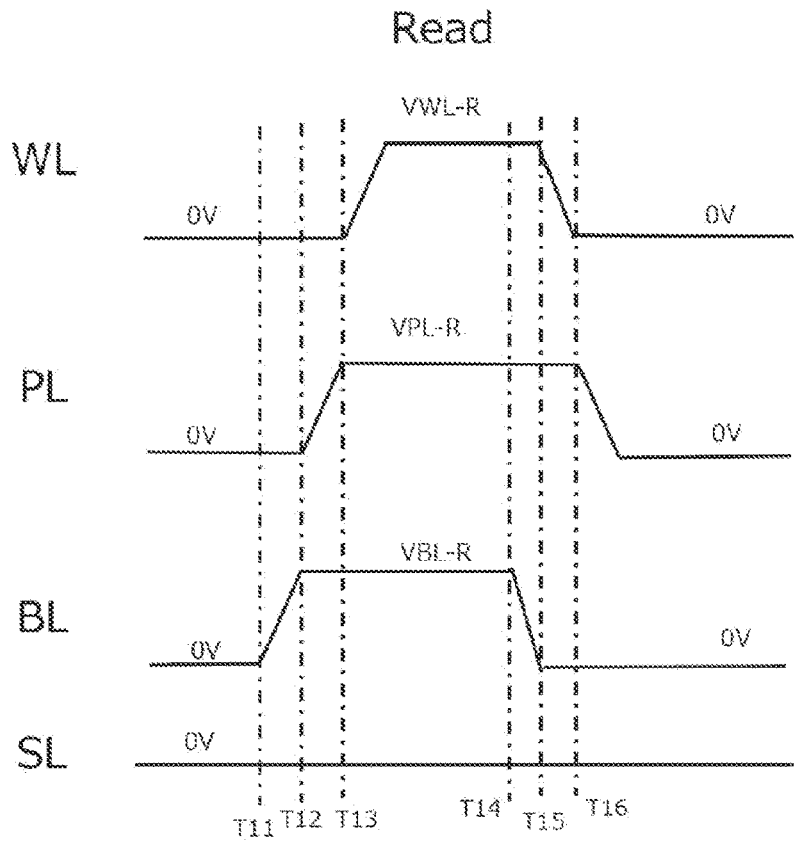
Figure 7A:
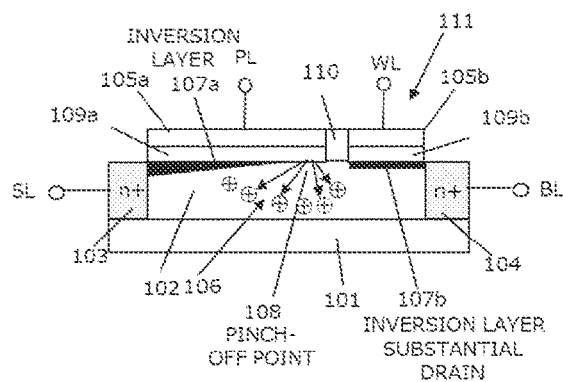
FIGS. 7A to 7D are views each illustrating a cross-sectional structure and an operation of a conventional dynamic flash memory device.
Figure 7B:
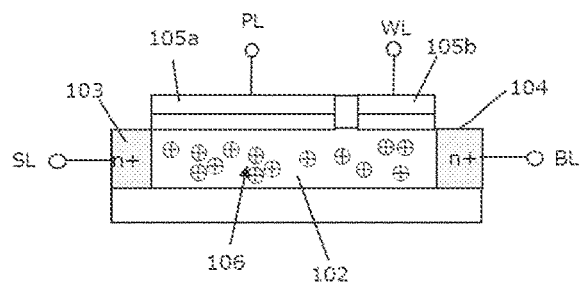
Figure 7C:
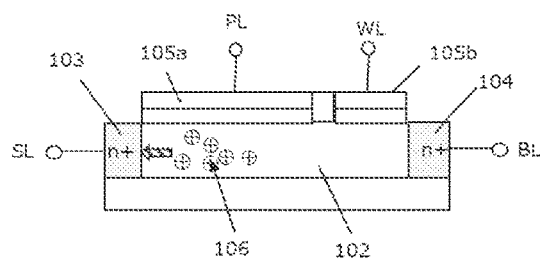
Figure 7D:
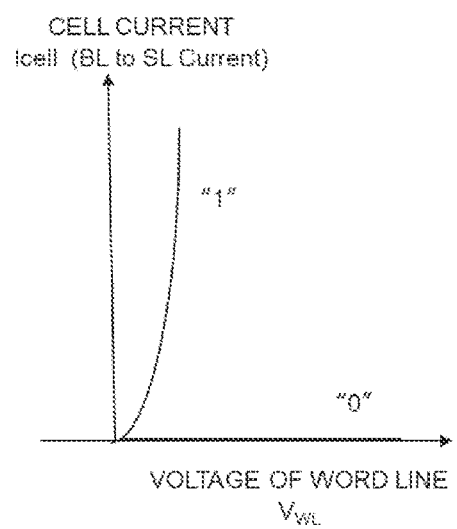

As illustrated in FIG. 6B, it is also possible to use a method of, after reading the information, first lowering the voltage of the bit line BL from the voltage VBL-R to the ground voltage Vss at the fourteenth time T14, and then lowering the voltage of the word line WL from the voltage VWL-R to the ground voltage Vss at the fifteenth time T15, and further lowering the voltage of the plate line PL from the voltage VPL-R to the ground voltage Vss at the sixteenth time T16. Alternatively, the order in which the voltage of the word line WL is lowered and the voltage of the plate line PL is lowered may be reversed.

Although the examples in FIGS. 1AA to 6B illustrate a case where the n⁺ layers 2 and 3 are provided and the majority carriers for writing are holes, the description is similarly applicable to a case where p⁺ layers are provided instead of the n⁺ layers and the majority carriers for writing are electrons for each of a write operation, an erase operation, and a read operation. However, since the value of a current becomes either positive or negative depending on its flow direction, the expression "high" or "low" may be inappropriate depending on circumstances. Thus, for example, it would be more appropriate to say that "the absolute value of a current flowing through the bit line BL during a memory erase operation is lower than that during a memory write operation."

As described in the present embodiment, the present dynamic flash memory cell may have any structure that satisfies the condition that the holes 17 generated through an impact ionization phenomenon are retained in the p layer 1. To this end, it is acceptable as long as the p layer 1 has a floating body structure isolated from the substrate 20. Accordingly, the foregoing dynamic flash memory operation can be performed even when the p layer 1 is formed horizontally on the substrate 20 using the GAA (Gate All Around; for example, see E. Yoshida: "A Capacitorless 1T-DRAM Technology Using Gate-Induced Drain-Leakage (GIDL) Current for Low-Power and High-Speed Embedded Memory, "IEEE IEDM (2006)) technology, which is one of SGTs, or the nanosheet technology (for example, see F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI, "IEICE Trans. Electron., Vol. E90-c., No. 4 pp. 765-771 (2007) and K. Sakui, N. Harada, "Dynamic Flash Memory with Dual Gate Surrounding Gate Transistor (SGT), "Proc. IEEE IMW, pp. 72-75 (2021)), for example. Alternatively, a device structure using SOI (Silicon On Insulator; for example, see J. Wan, L. Rojer, A. Zaslaysky, and S. Critoloveanu: "A Compact Capacitor-Less High-Speed DRAM Using Field Effect-Controlled Charge Regeneration," Electron Device Letters, Vol. 35, No. 2, pp. 179-181 (2012), Takashi Ohasawa and Takeshi Hamamoto, "Floating Body Cell-a Novel Body Capacitorless DRAM Cell", Pan Stanford Publishing (2011), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006), and E. Yoshida: "A Capacitorless 1T-DRAM Technology Using Gate-Induced Drain-Leakage (GIDL) Current for Low-Power and High-Speed Embedded Memory, "IEEE IEDM (2006)) may also be used. In such a device structure, the bottom of the channel region is in contact with an insulating layer of a SOI substrate, and the channel region is surrounded by a gate insulating layer and element isolation insulating layers together with other channel regions. Even in such a structure, the channel region has a floating body structure. In this manner, it is acceptable as long as the dynamic flash memory element provided in the present embodiment satisfies the condition that its channel region has a floating body structure. Further, even with a structure in which a Fin transistor (for example, J. Y. Song, W. Y. Choi, J. H. Park, J. D. Lee, and B-G. Park: "Design Optimization of Gate-All-Around (GAA) MOSFETs," IEEE Trans. Electron Devices, vol. 5, no. 3, pp. 186-191, (2006)) is formed on a SOI substrate, the present dynamic flash memory operation can be performed as long as its channel region has a floating body structure.

The present embodiment has the following features.

(Feature 1)

The present embodiment is characterized in that, in a memory write operation, as illustrated in FIG. 3, the voltage of the plate line PL is increased after the voltage of the bit line BL has increased, and then, the voltage of the word line is increased. According to such waveforms, an inversion layer is formed on the inner side of the gate insulating layer 6 of the PL-FET forming the dynamic flash memory, and the voltage of the bit line BL is applied to the inversion layer, and then, the voltage of the word line is increased. Such waveforms allow the WL-FET to have the gate voltage increased after its drain voltage is increased, which can temporarily maximize the impact ionization rate in the WL-FET. Thus, it is possible to perform a memory write operation that is efficient in generating more majority carriers in the semiconductor base material, and storing the generated carriers therein.

(Feature 2)

The present embodiment is characterized in that, in a memory write operation, as illustrated in FIG. 3, the voltage of the word line is lowered before the voltage of the bit line BL is lowered, and then, the voltage of the plate line PL is lowered. According to such waveforms, the voltage of the word line is lowered while an inversion layer is formed on the inner side of the gate insulating layer 6 of the PL-FET forming the dynamic flash memory, and the voltage of the bit line BL is being applied. Such waveforms allow the WL-FET to have the gate voltage lowered while its drain voltage remains high, which can temporarily maximize the impact ionization rate in the WL-FET. Thus, it is possible to perform a memory write operation that is efficient in generating more majority carriers in the semiconductor base material, and storing the generated carriers therein.

(Feature 3)

According to a memory erase operation of the present embodiment, the memory erase operation can be performed with low power consumption. As illustrated in FIG. 5, the present invention is characterized in that, in a memory erase operation, the voltage of the plate line PL is increased first to form an inversion layer on the inner side of the gate insulating layer 6 of the PL-FET so that the area in which holes and electrons recombine is increased, and then, a potential is applied to the bit line BL so that the electrons are supplemented from the source side. When data is retained in the memory, the area in which holes stored in the memory cell recombine with electrons is determined by the portion where the n⁺ layer 3 and the p layer 1 are in contact with each other. In contrast, when data is erased from the memory, the area in which holes and electrons recombine can be increased than that when data is retained in the memory, thus increasing chances for recombination of electrons and holes because the entire inversion layer 14b formed on the inner side of the gate insulating layer 6 is electrically connected to the n⁺ layer 3. Further, since the WL-FET is not on at this time, no current flows from the bit line BL to the source line SL, and thus, impact ionization that would disturb the erase operation does not occur in the p layer 1.

(Feature 4)

According to a memory read operation of the present embodiment, memory reading that ensures a wide operation margin and is resistant against read disturb failures can be performed. During memory reading, the voltage applied to the plate line PL is set to a value between the Vth-PL(1) and the Vth-PL(0) corresponding to erasing "0." Thus, when the logical memory data "1" is read, the PL-FET is turned on, and when the logical memory data "0" is read, the PL-FET is turned off. This significantly increases the on/off ratio of the memory cell current, and thus can implement a memory with a wide operation margin.

Further, the signal waveforms of the read operation ensure that even when the conditions of voltages applied to the bit line BL, the plate line PL, and the word line WL may disturb the storage/retention of information in a memory cell that is not a read target, the information stored in the memory cell is unlikely to be destroyed, that is, so-called read disturb failures are unlikely to occur.

(Feature 5)

In the dynamic flash memory according to the first embodiment of the present invention, there is no need to apply voltages of opposite polarity to the source line SL, the word line WL, the plate line PL, and the bit line BL during a memory write operation, a memory erase operation, and a memory read operation. Thus, the operations can be performed with voltages of the same polarity or 0 V. This can simplify the peripheral detection circuit and the drive circuit, and reduce the overall size of the device. This can also prevent a decrease in the reliability of the gate oxide film of the WL-FET or the PL-FET that would otherwise occur when a large electric field is applied to the oxide film as in the conventional single-transistor DRAM.

The present invention can be implemented in various embodiments and modifications without departing from the broad spirit and scope of the present invention. In addition, each of the foregoing embodiments only describes an example of the present invention and is not intended to limit the scope of the present invention. The foregoing examples and modified examples may be combined as appropriate. Further, even if some of the components of the foregoing embodiments are removed as needed, the resulting structure is within the technical idea of the present invention.

With the semiconductor elements according to the present invention, it is possible to provide a semiconductor memory device with higher density, higher operation speed, and higher operation margin than those of the conventional devices.

What is claimed is:

1. A memory device with semiconductor elements, comprising:
a semiconductor base material extending on a substrate in a horizontal direction or a vertical direction;
a first impurity layer and a second impurity layer that are continuous with respective opposite ends of the semiconductor base material;
a first gate insulating layer partially covering the semiconductor base material;
a first gate conductor layer covering the first gate insulating layer;
a second gate insulating layer partially covering the semiconductor base material; and
a second gate conductor layer not in contact with the first gate conductor layer, the second gate conductor layer covering the second gate insulating layer,
wherein a memory write operation is performed by first applying a first voltage to allow a potential difference to be generated between the first impurity layer and the second impurity layer, and then applying second and third voltages each having the same polarity as a polarity of the first voltage to the first gate conductor layer and the second conductor layer, respectively, thereby increasing majority carriers in the semiconductor base material through an impact ionization phenomenon,
a memory erase operation is performed by first applying a fourth voltage to one of the first gate conductor layer and the second gate conductor layer, and then applying a fifth voltage having the same polarity as a polarity of the fourth voltage to allow a potential difference to be generated between the first impurity layer and the second impurity layer, thereby reducing majority carriers remaining in the semiconductor base material, and
a memory read operation is performed by first applying a sixth voltage to allow a potential difference to be generated between the first impurity layer and the second impurity layer, and then applying a seventh voltage to one of the first gate conductor layer and the second gate conductor layer, and thereafter applying an eighth voltage having the same polarity as a polarity of the seventh voltage to another of the first gate conductor layer and the second gate conductor layer.

2. The memory device with the semiconductor elements according to claim 1,
wherein the first impurity layer is connected to a source line, the second impurity layer is connected to a bit line, one of the first gate conductor layer and the second gate conductor layer is connected to a word line, and another of the first gate conductor layer and the second gate conductor layer is connected to a plate line, and
an operation of a dynamic flash memory is performed by applying a voltage to each of the source line, the bit line, the plate line, and the word line to execute the memory write operation, the memory read operation, and the memory erase operation.

3. The memory device with the semiconductor elements according to claim 2,
wherein the write operation for the dynamic flash memory includes
applying the first voltage to one of the first impurity layer and the second impurity layer to allow a potential difference to be generated between the first impurity layer and the second impurity layer, and
then applying the second voltage to one of the first gate conductor layer and the second gate conductor layer, the second voltage having the same polarity as a polarity of the first voltage and having an absolute value greater than an absolute value of a threshold voltage of a transistor including the gate conductor layer, and
then applying the third voltage to another of the first gate conductor layer and the second gate conductor layer, the third voltage having the same polarity as a polarity of the first voltage and having an absolute value greater than an absolute value of a threshold voltage of a transistor including the gate conductor layer.

4. The memory device with the semiconductor elements according to claim 2,
wherein the write operation for the dynamic flash memory includes, before lowering the first voltage applied to the first impurity layer or the second impurity layer, lowering the second and third voltages applied to the first gate conductor layer and the second gate conductor layer, respectively.

5. The memory device with the semiconductor elements according to claim 2, wherein the erase operation for the dynamic flash memory includes
applying the fourth voltage to one of the first gate conductor layer and the second gate conductor layer, the fourth voltage having the same polarity as a polarity of a threshold voltage of a transistor including the gate conductor layer and having an absolute value greater than an absolute value of the threshold voltage, and
then applying the fifth voltage having the same polarity as a polarity of the fourth voltage to allow a potential difference to be generated between the first impurity layer and the second impurity layer, thereby reducing majority carriers remaining in the semiconductor base material.

6. The memory device with the semiconductor elements according to claim 2, wherein the read operation for the dynamic flash memory includes
applying the sixth voltage to allow a potential difference to be generated between the first impurity layer and the second impurity layer, and
then applying the seventh voltage to one of the first gate conductor layer and the second gate conductor layer, the seventh voltage having a level between a threshold voltage for the memory writing operation and a threshold voltage for the memory erasing operation of a transistor including the gate conductor layer, and
thereafter applying the eighth voltage to another of the first gate conductor layer and the second gate conductor layer, the eighth voltage having the same polarity as a polarity of the seventh voltage and having an absolute value greater than an absolute value of a threshold voltage for erasing of a transistor including the gate conductor layer.

7. The memory device with the semiconductor elements according to claim 2,
wherein in each of the write operation, the erase operation, and the read operation for the dynamic flash memory, when majority carriers in the semiconductor base material are holes, a voltage of 0 V or a positive potential is applied to the first impurity layer, the second impurity layer, the first gate conductor layer, and the second gate conductor layer.

8. The memory device with the semiconductor elements according to claim 2,
wherein in each of the write operation, the erase operation, and the read operation for the dynamic flash memory, when majority carriers in the semiconductor base material are electrons, a voltage of 0 V or a negative potential is applied to the first impurity layer, the second impurity layer, the first gate conductor layer, and the second gate conductor layer.

9. The memory device with the semiconductor elements according to claim 2,
wherein an absolute value of a current flowing through the bit line during the memory erase operation for the dynamic flash memory is lower than an absolute value of a current flowing through the bit line during the memory write operation for the dynamic flash memory.

10. The memory device with the semiconductor elements according to claim 2,
wherein the voltages applied to the plate line, the word line, the source line, and the bit line during the memory write operation, the memory erase operation, and the memory read operation for the dynamic flash memory are 0 V or voltages having the same polarity.

11. The memory device with the semiconductor elements according to claim 2,
wherein in the memory write operation for the dynamic flash memory, a maximum electric field generated in the semiconductor base material due to the potential difference generated between the first impurity layer and the second impurity layer is greater than or equal to $10^5$ V/cm.

12. The memory device with the semiconductor elements according to claim 2,
wherein in the memory erase operation for the dynamic flash memory, a maximum electric field generated in the semiconductor base material due to the potential difference generated between the first impurity layer and the second impurity layer is greater than or equal to $10^4$ V/cm.

13. The memory device with the semiconductor elements according to claim 2,
wherein in the memory read operation for the dynamic flash memory, a maximum electric field generated in the semiconductor base material due to the potential difference generated between the first impurity layer and the second impurity layer is greater than or equal to $10^5$ V/cm.

* * * * *